United States Patent [19]
Lim et al.

[11] Patent Number: 5,569,571
[45] Date of Patent: Oct. 29, 1996

[54] PROCESS FOR PREPARING BLACK MATRIX FOR A COLOR TUBE BY ETCHING

[75] Inventors: Ik-Cheol Lim; Su-Yeon Cho, both of Suwon; Seung-Joon Yoo, Anyang, all of Rep. of Korea

[73] Assignee: Samsung Display Devices Co., Ltd., Kyunggi-do, Rep. of Korea

[21] Appl. No.: 472,702

[22] Filed: Jun. 6, 1995

[30] Foreign Application Priority Data

Dec. 27, 1994 [KR] Rep. of Korea .................. 94-37462

[51] Int. Cl.$^6$ .................................................. G03C 5/00
[52] U.S. Cl. ........................... 430/25; 430/28; 430/29; 430/291; 430/325
[58] Field of Search ........................... 430/25, 322, 323, 430/24, 28, 29, 291, 394, 325

[56] References Cited

U.S. PATENT DOCUMENTS 4,681,824  7/1987  Tomita .................... 430/25

Primary Examiner—Thorl Chea
Attorney, Agent, or Firm—Christie, Parker & Hale, LLP

[57] ABSTRACT

A process for preparing a black matrix comprising the steps of producing a developed substrate by coating, drying, exposing and developing a photoresist on the inside of a substrate, producing a dried substrate by drying the developed substrate several times, coating a dye on the dried substrate and then drying the board, coating graphite on the dried substrate, and etching the graphite-coated substrate. This method makes it possible to perfectly etch the black matrix dot and increase volatility in fluorescent coating.

3 Claims, 5 Drawing Sheets

PROCESS FOR PREPARING BLACK MATRIX FOR A COLOR TUBE BY ETCHING

BACKGROUND OF THE INVENTION

1. Field of the Invention

The present invention relates to a black matrix which is used for manufacturing color picture tube or color display tube, and more particularly, to a process for preparing a black matrix where clear black matrix dots can be produced by etching graphite effectively.

2. Description of the Related Art

In the conventional process for preparing a black matrix which is used for manufacturing a CPT (Color Picture Tube) or a CDT (Color Display Tube), a photoresist such as PVP and DAS, PVA and ADC, polyvinyl alcohol is uniformly coated on a substrate, i.e., a panel, and the photoresist is dried by heating and then exposed to ultraviolet rays on the substrate provided with a mask assembly through mask slots, as shown in FIG. 4. The exposed substrate is separated from the mask assembly, washed with distilled water, developed by removing unexposed photoresist, and dried. Graphite solution is uniformly coated on the inside of the panel on which the photoresist-coated portion and the photoresist-uncoated portion are regularly arranged. Subsequently, graphite-coated photoresist is removed using an etching solution such as sulfuric acid, sulfonic acid, hydrogen peroxide, chromatic acid, etc., to produce a black matrix. In this conventional process for preparing a black matrix, photoresist dots formed by exposing and developing have a flat shape in the central portion, whereas they have a tilt shape (5) in the circumference as shown in FIG. 5. Accordingly, imperfect etching of black matrix dots may occur as shown in FIG. 6.

SUMMARY OF THE INVENTION

The present invention is to solve the above-described problems in the prior art. It is an object of the present invention to provide a process for preparing a black matrix enabling perfect etching of black matrix dots.

To achieve the above objective, the present invention provides a process for preparing a black matrix comprising the steps of coating, drying, exposing and developing photoresist on a substrate to produce the developed substrate, drying the developed substrate several times to produce the dried substrate, coating a dye on the dried substrate and then drying the board, coating graphite on the dried substrate, and etching the graphite-coated board.

In the present invention, it is preferable that the dye is one of the compound selected from the group consisting of Direct Yellow 27 ($C_{24}H_{20}N_4Na_2O_9S_3$) and Direct Red 28 ($C_{32}H_{22}N_6Na_2O_6S_2$) or a mixture thereof. And it is preferable that the concentration of the dye is 0.001 to 2 weight %.

DETAILED DESCRIPTION OF THE INVENTION

Figure 1:
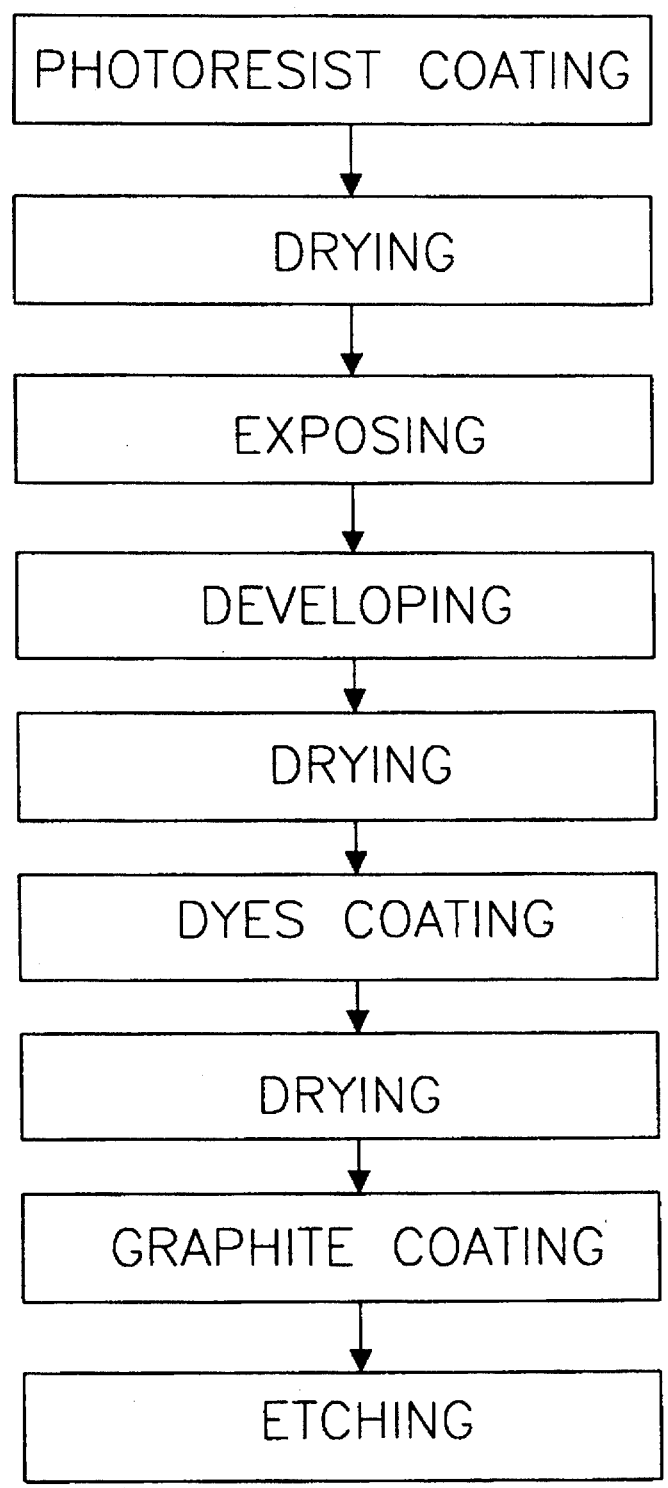
FIG. 1 is a schematic flow chart in which the process for preparing a black matrix of the present invention is shown.
Figure 2:
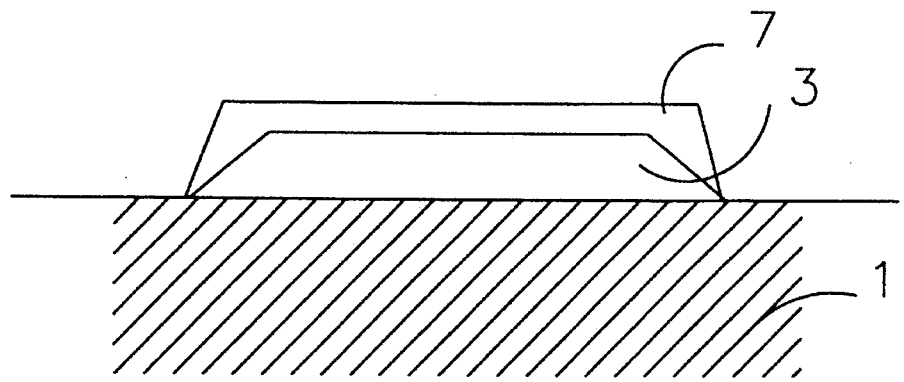
FIG. 2 is a cross-sectional view of a photoresist dot having double coatings of photoresist and dye which is produced by the process of the present invention.

In the process for preparing a black matrix according to the present invention, a photoresist, such as PVP and DAS, PVA and ACD, polyvinyl alcohol, is uniformly coated on the inside of a substrate (1) as shown in FIG. 1. The photoresist is dried by heating and then the substrate assembled with a mask is exposed to ultraviolet rays through mask slots. The exposed substrate is separated from the mask assembly, washed with distilled water, developed by removing unexposed photoresist, and dried. According to the above method, a dye such as Direct Yellow 27 or Direct Red 28 is coated on the inside of the substrate on which the photoresist-coated portion and photoresist-uncoated portion are regularly arranged, and the photoresist dots having a dye coating (7) on the upper portion of the photoresist coat (3) are formed as shown in FIG. 2. Subsequently, graphite solution is uniformly coated and then the graphite-coated photoresist is removed using an etching solution such as sulfuric acid, sulfonic acid, hydrogen peroxide, chromatic acid, etc., to produce a black matrix.

Preferably, examples and reference examples are described below. These examples are exemplary only, and the present invention is not restricted to the scope of the examples.

EXAMPLE 1

A photoresist (PVP-DAS) was uniformly coated on the inside of a 14" CPT panel with a thickness of 1 μm and then exposed to ultraviolet rays in the wavelengths of 250–600 nm for 20 seconds using a super high-pressure mercury lamp. The exposed panel was developed with a developing solution (distilled water) and dried to produce photoresist dots on the panel by ambient drying at 25° C. for 3 minutes. 0.2 weight % of Direct Yellow 27 (manufactured by Aldrich Corp.) was coated on the dried photoresist dots at 150 rpm and dried at 25° C. for 3 minutes. 5 weight % of graphite solution was coated thereon with a thickness of 1 μm. And then 5 weight % of aqueous solution of $H_2SO_4$ (etching solution) was used for etching to produce black matrix dots.

EXAMPLE 2

Photoresist (PVP-DAS) was uniformly coated on the inside of a 14" CPT panel with a thickness of 1 μm and then exposed to ultraviolet rays in the wavelengths of 250–600 nm for 20 seconds using a super high-pressure mercury lamp. The exposed panel was developed with a developing solution (distilled water) and dried to produce photoresist dots on the panel by ambient drying at 25° C. for 3 minutes. 0.5 weight % of Direct Red 28 (manufactured by Aldrich Corp.) was coated on the dried photoresist dots at 150 rpm and dried at 25° C. for 3 minutes. 5 weight % of graphite solutions was coated thereon with a thickness of 1 μm. And then 5 weight % of aqueous solution of $H_2SO_4$ (etching solution) was used for etching to produce black matrix dots.

Figure 3:
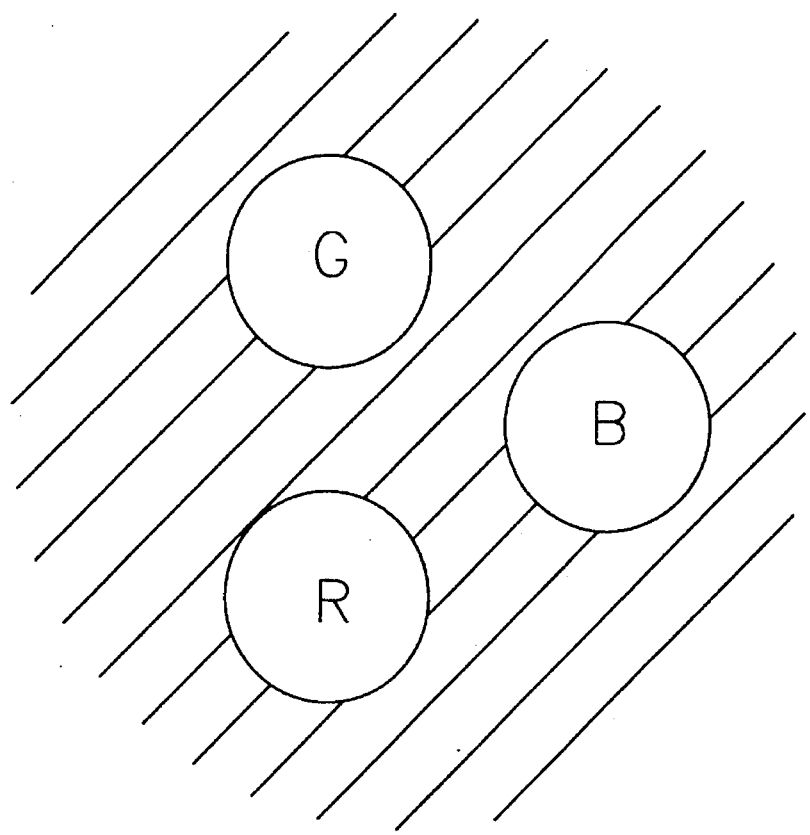
FIG. 3 is a top view of a black matrix produced by the process of the present invention.
Figure 4:
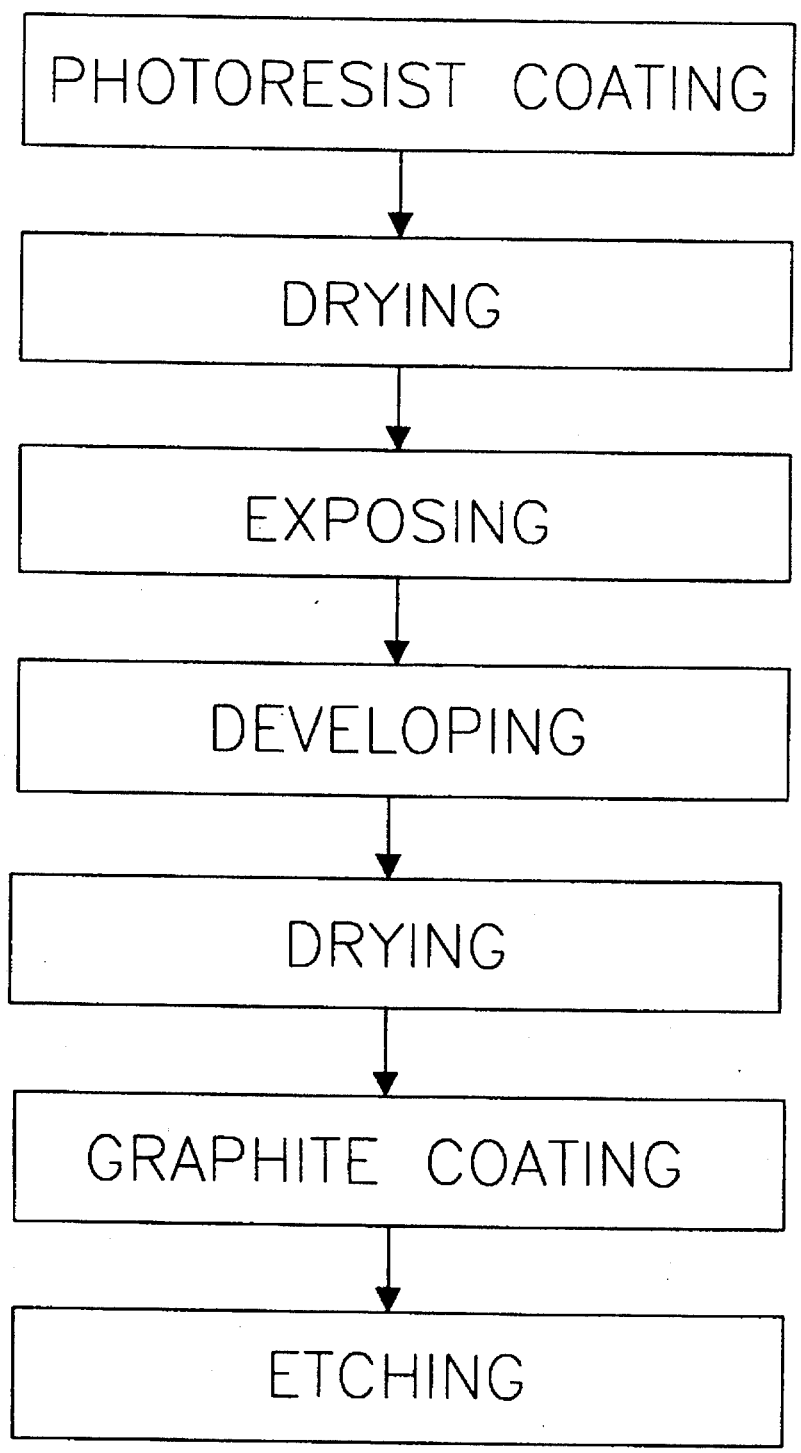
FIG. 4 is a flow chart in which the process for preparing a black matrix of the conventional art is shown.
Figure 5:
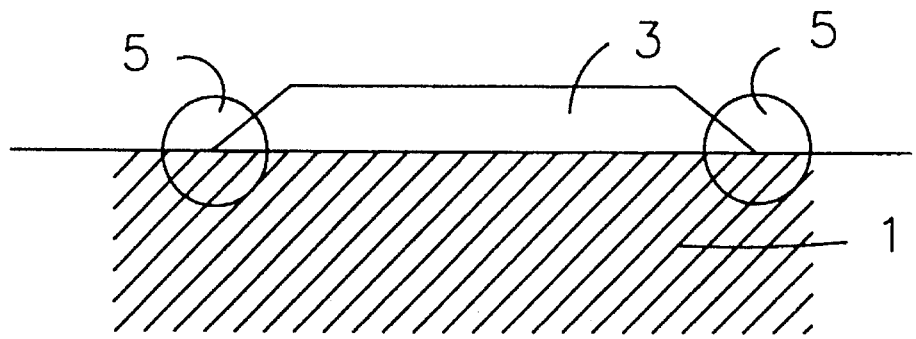
FIG. 5 is a cross-sectional view of a photoresist dot produced by the process of the prior art.
Figure 6:
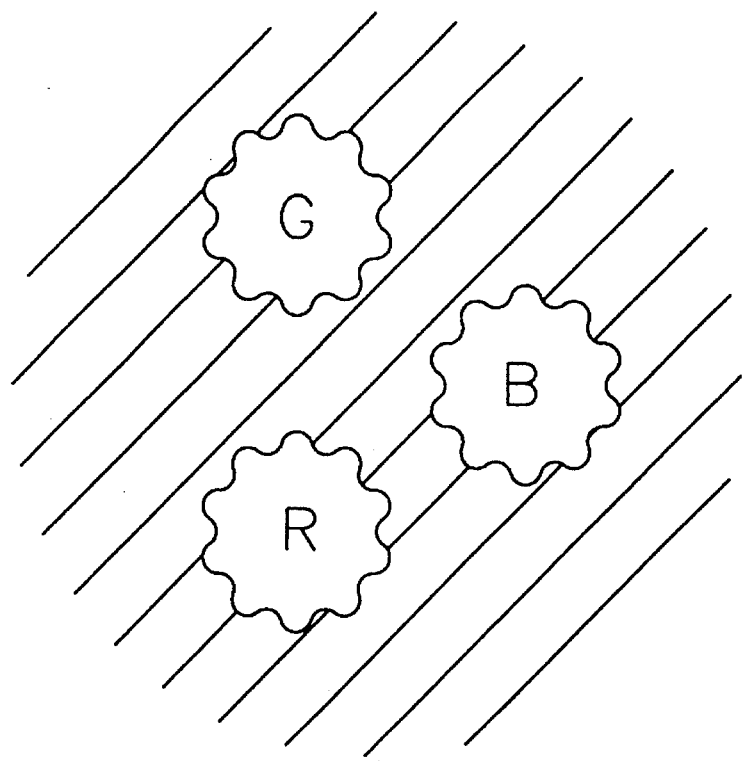
FIG. 6 is a top view of a black matrix produced by the process of the prior art.
Figure 7:
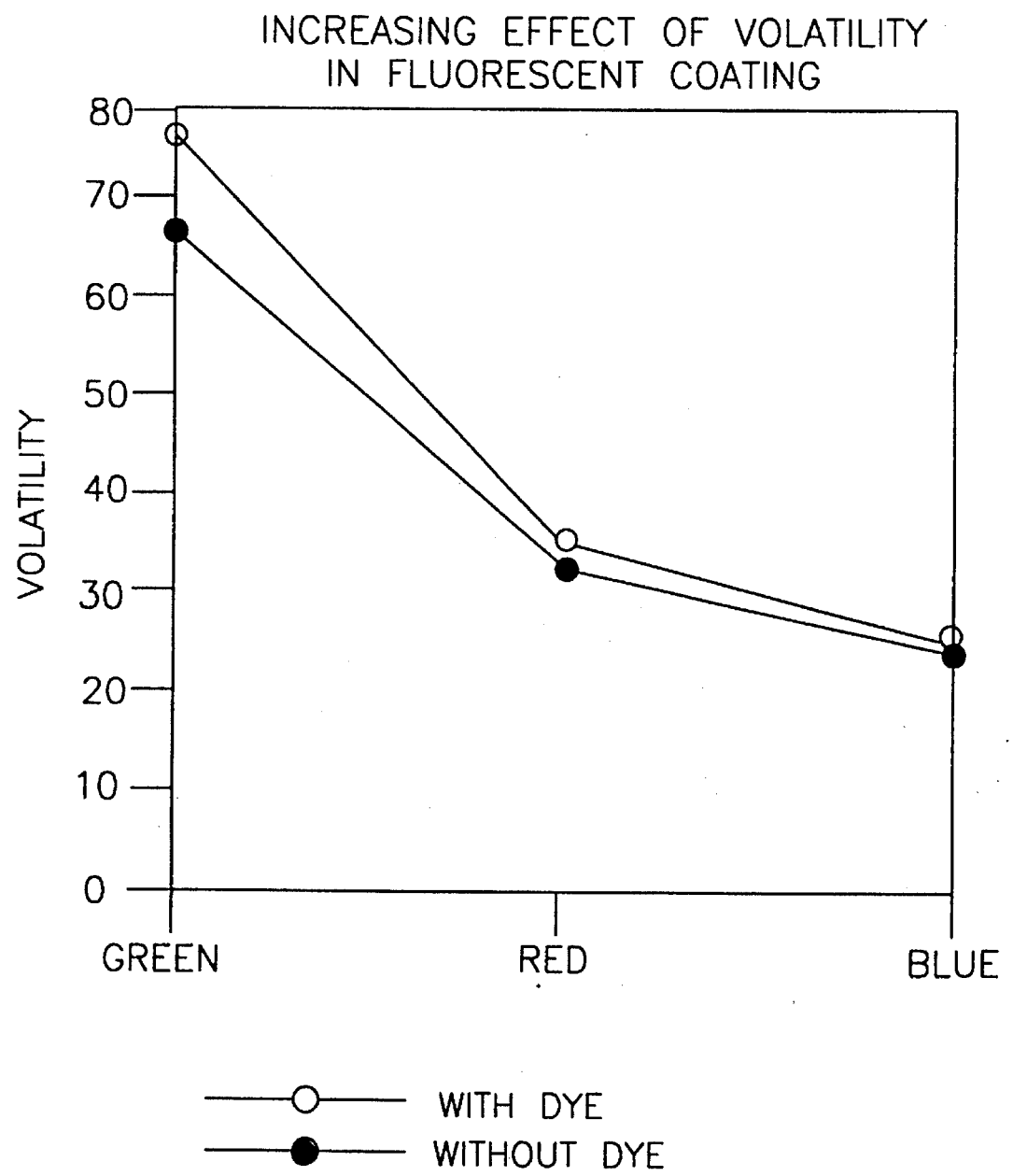
FIG. 7 is a graph in which the increasing effect of volatility in fluorescent coating of the present invention is shown.

As shown in FIG. 3, a black matrix produced by a process shown in the examples of the present invention is capable of far more perfect etching compared with a black matrix produced by a process of the conventional art. Accordingly, the area in the dots is widened and volatility is increased upon fluorescent coating.

Volatility test for 0.28 dot (14 inch) was performed to ensure the effect of the present invention. Volatility of green, blue and red fluorescent coating was examined by a MINOLTA volatility measuring instrument under high voltage (25 KV) and current (500 µA). The results of this test were shown in Table 1.

TABLE 1

| Volatility | Green | Red | Blue |
|---|---|---|---|
| Without dye | 67.4 | 21 | 10.9 |
| With dye | 76.7 | 23.5 | 12.2 |

Therefore the present invention provides a process for preparing a black matrix which makes it possible to perfectly etch the black matrix dot and increase volatility in fluorescent coating.

What is claimed is:

1. A process for preparing a black matrix comprising the steps of:

coating, drying, exposing and developing a photoresist on a substrate to produce a developed substrate;

drying the developed substrate to produce a dried developed substrate;

coating a dye on the dried developed substrate and then drying the dye to produce a dye coated substrate;

coating graphite on the dye coated substrate to produce a graphite-coated substrate; and etching the graphite-coated substrate to produce the black matrix.

2. A process for preparing a black matrix as claimed in claim 1, wherein said dye is a compound selected from the group consisting of Direct Yellow 27 $C_{24}H_{20}N_4Na_2O_9S_3$, Direct Red 28 $C_{32}H_{22}N_6Na_2O_6S_2$, and a mixture thereof.

3. A process for preparing a black matrix as claimed in claim 1, wherein the concentration of said dye is 0.01 to 2 weight %.

* * * * *

UNITED STATES PATENT AND TRADEMARK OFFICE
CERTIFICATE OF CORRECTION

PATENT NO. : 5,569,571
DATED : October 29, 1996
INVENTOR(S) : Ik-Cheol Lim; Su-Yeon Cho; Seung-Joon Yoo It is certified that error appears in the above-indentified patent and that said Letters Patent is hereby corrected as shown below:

Column 1, line 9, before "color" insert -- a -- (both occurrences).
Column 1, line 53, change "compound" to -- compounds --.
Column 2, line 65, change "solutions" to -- solution --.
Column 3, line 7, change "inch" to -- inches --.
Column 1, line 16, before "CPT" delete --a-- and line 17, before "CDT" delete --a--.

Signed and Sealed this

Eleventh Day of November, 1997

Attest:

BRUCE LEHMAN

*Attesting Officer*     Commissioner of Patents and Trademarks